US012525423B2

(12) United States Patent
Yoshihara et al.

(10) Patent No.: US 12,525,423 B2
(45) Date of Patent: Jan. 13, 2026

(54) CHARGED PARTICLE BEAM DEVICE

(71) Applicant: Hitachi High-Tech Corporation, Tokyo (JP)

(72) Inventors: Mai Yoshihara, Tokyo (JP); Wei Chean Tan, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 687 days.

(21) Appl. No.: 17/911,711

(22) PCT Filed: Mar. 26, 2020

(86) PCT No.: PCT/JP2020/013522

§ 371 (c)(1),
(2) Date: Sep. 15, 2022

(87) PCT Pub. No.: WO2021/192123

PCT Pub. Date: Sep. 30, 2021

(65) Prior Publication Data

US 2023/0178331 A1 Jun. 8, 2023

(51) Int. Cl.

*H01J 37/22* (2006.01)
*H01J 37/18* (2006.01)
*H01J 37/28* (2006.01)

(52) U.S. Cl.

CPC ............ *H01J 37/222* (2013.01); *H01J 37/18* (2013.01); *H01J 37/28* (2013.01); *H01J 2237/182* (2013.01)

(58) Field of Classification Search

CPC .......... H01J 37/00; H01J 37/02; H01J 37/222; H01J 37/26; H01J 37/28; H01J 37/18;

(Continued)

(56) References Cited

U.S. PATENT DOCUMENTS 4,973,818 A 11/1990 Bittenbruenn et al.
5,192,866 A 3/1993 Komi (Continued)

FOREIGN PATENT DOCUMENTS

JP 2-30724 A 2/1990
JP 4-87148 A 3/1992

(Continued)

OTHER PUBLICATIONS

International Search Report (PCT/ISA/210) issued in PCT Application No. PCT/JP2020/013522 dated Jun. 30, 2020 with English translation (four (4) pages).

(Continued)

*Primary Examiner* — Jason L Mccormack

(74) *Attorney, Agent, or Firm* — Crowell & Moring LLP

(57) ABSTRACT

Improved is the reliability of sample analysis performed using a charged particle beam apparatus.

The charged particle beam apparatus includes region setting means for setting an irradiation region for irradiating a sample with an electron beam and an irradiation prohibited region for prohibiting the irradiation of the sample with the electron beam using a low-magnification image of the sample captured under low vacuum. In addition, the charged particle beam apparatus includes captured image acquisition means for selectively irradiating the irradiation region with the electron beam with the inside of a sample chamber under high-vacuum and acquiring a high-vacuum SEM image of the irradiation region based on the secondary or backscattered electrons emitted from the irradiation region.

12 Claims, 11 Drawing Sheets

(58) Field of Classification Search

CPC .... H01J 37/22; H01J 37/265; H01J 2237/182; H01J 2237/004; H01J 2237/221; H01J 2237/2605

USPC ................................. 250/306, 307, 310, 311

See application file for complete search history.

(56) References Cited

U.S. PATENT DOCUMENTS

| | | | | |
|---|---|---|---|---|
| 2009/0050822 A1* | 2/2009 | Nakasuji | H01J 37/06 | 250/492.2 |
| 2009/0206254 A1* | 8/2009 | Takahashi | H01J 37/3056 | 250/311 |
| 2009/0230304 A1* | 9/2009 | Hatano | H01J 37/28 | 250/311 |
| 2012/0001070 A1* | 1/2012 | Takagi | G02B 21/26 | 250/310 |
| 2012/0211652 A1 | 8/2012 | Sakamoto et al. | | |
| 2013/0299696 A1 | 11/2013 | Yamazaki | | |

FOREIGN PATENT DOCUMENTS

| | | | |
|---|---|---|---|
| JP | 2006-292682 | A | 10/2006 |
| JP | 2009-192428 | A | 8/2009 |
| JP | 2011-90940 | A | 5/2011 |
| JP | 2013-96900 | A | 5/2013 |

OTHER PUBLICATIONS

Japanese-language Written Opinion (PCT/ISA/237) issued in PCT Application No. PCT/JP2020/013522 dated Jun. 30, 2020 (four (4) pages).

* cited by examiner

[FIG. 1]
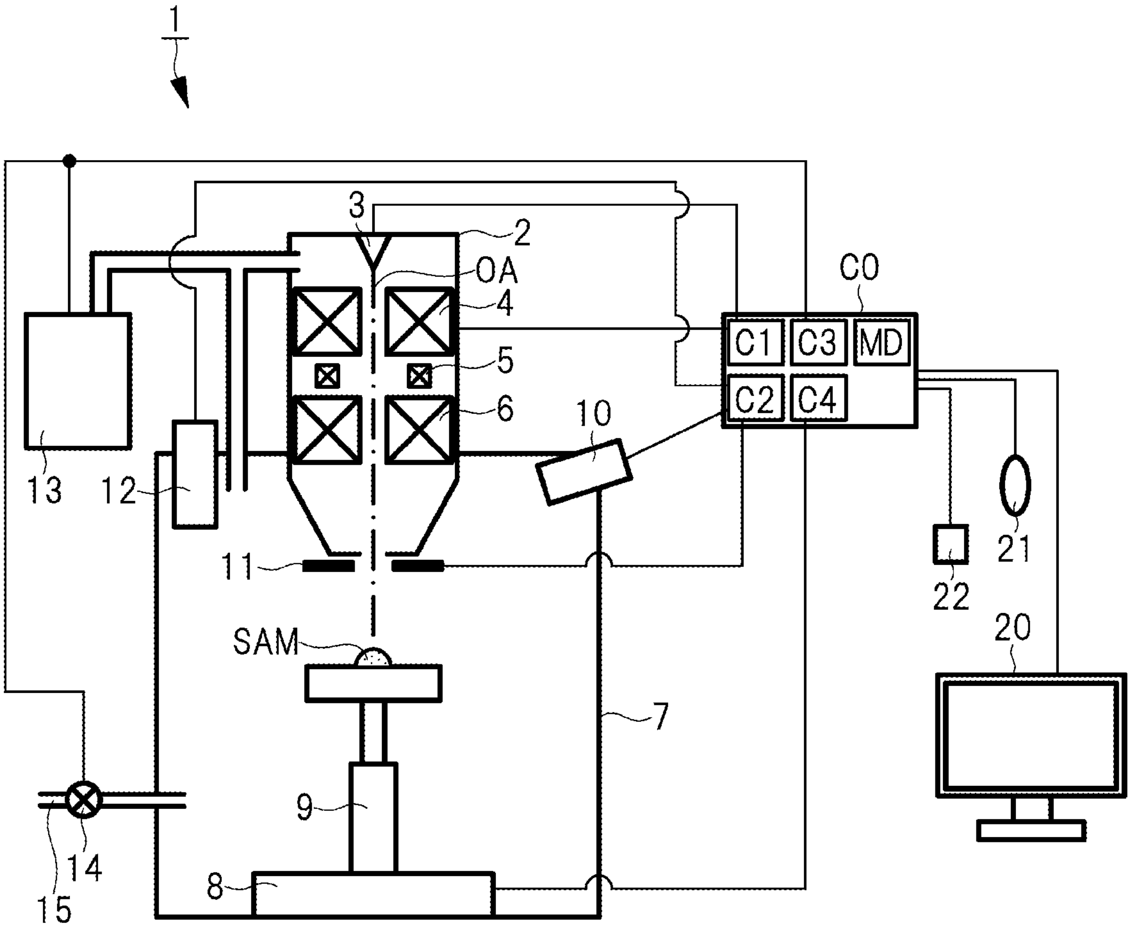

[FIG. 2]
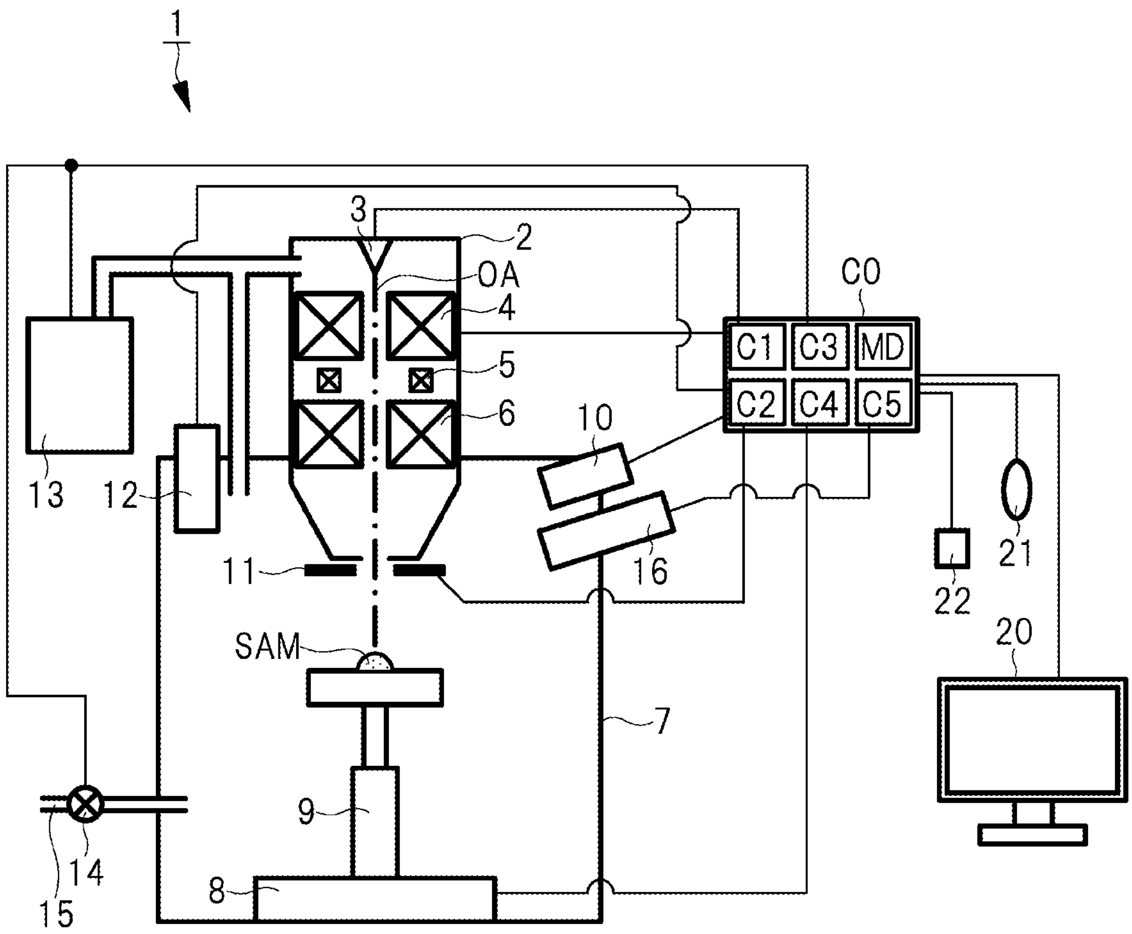

[FIG. 3]
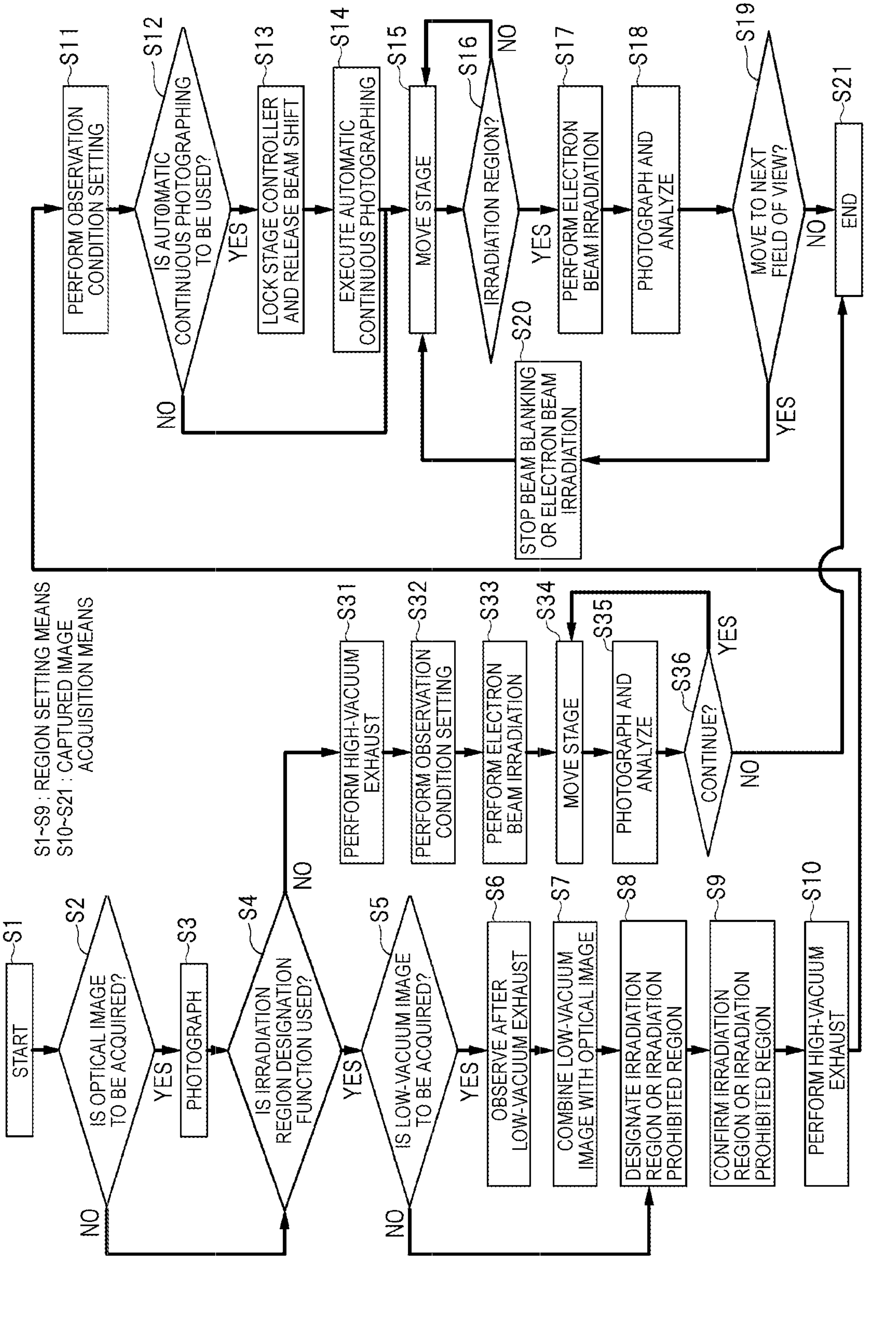

[FIG. 4]
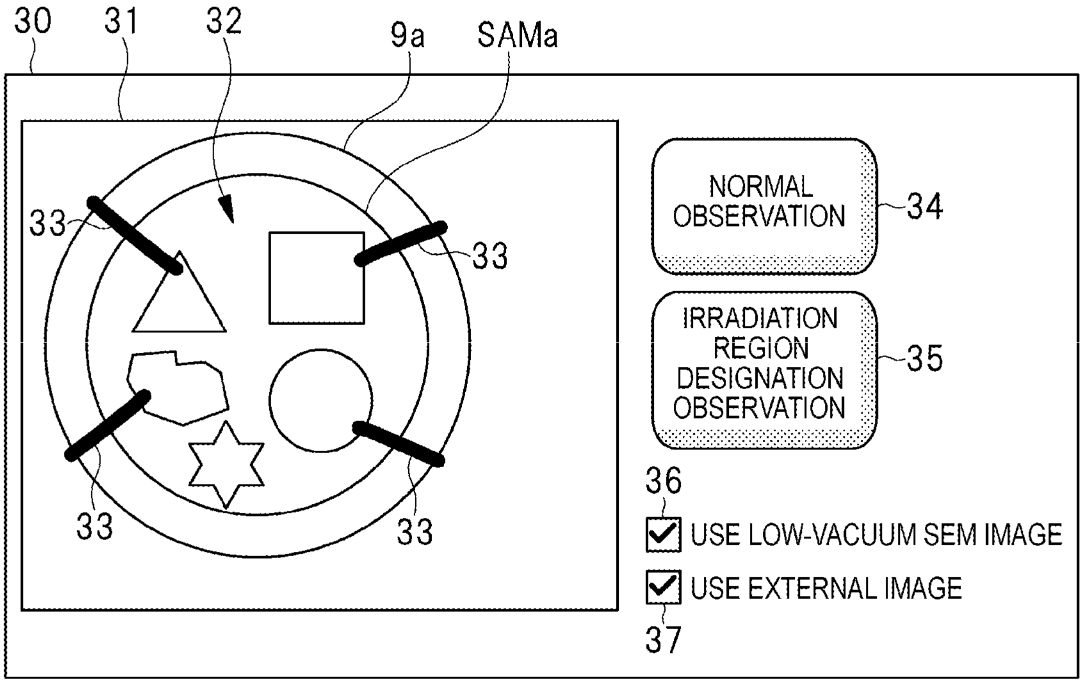
[FIG. 5]
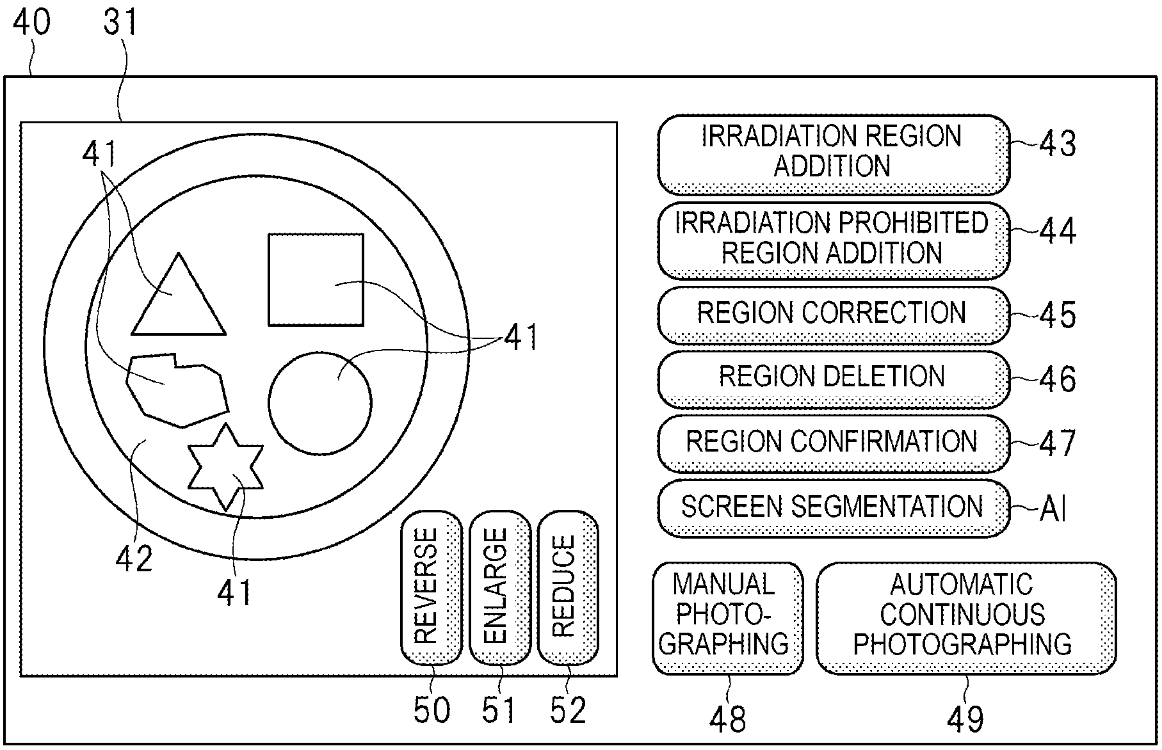

[FIG. 6]
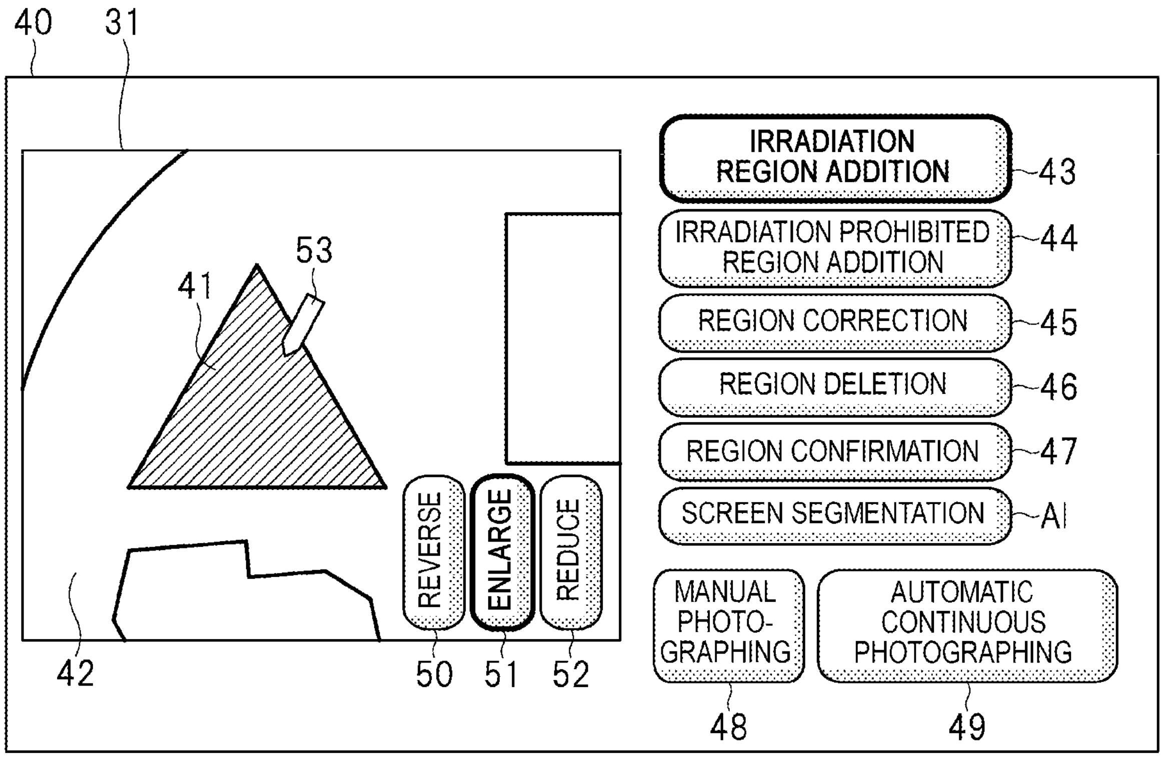
[FIG. 7]
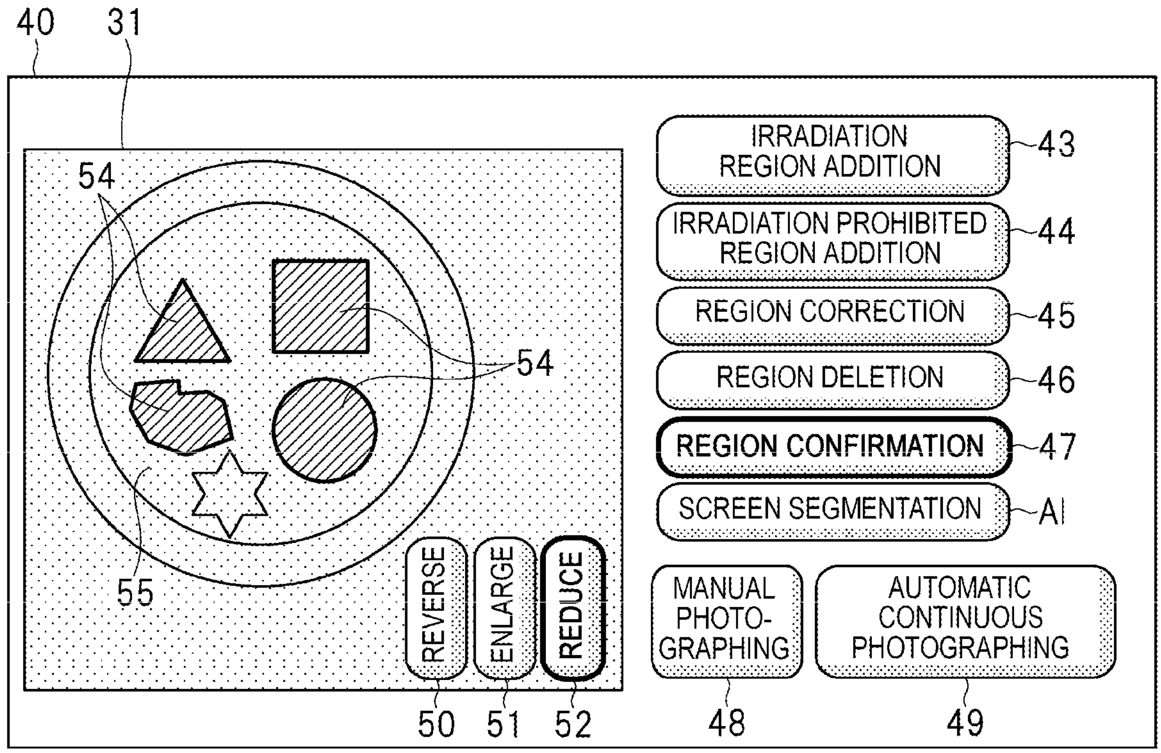

[FIG. 8]
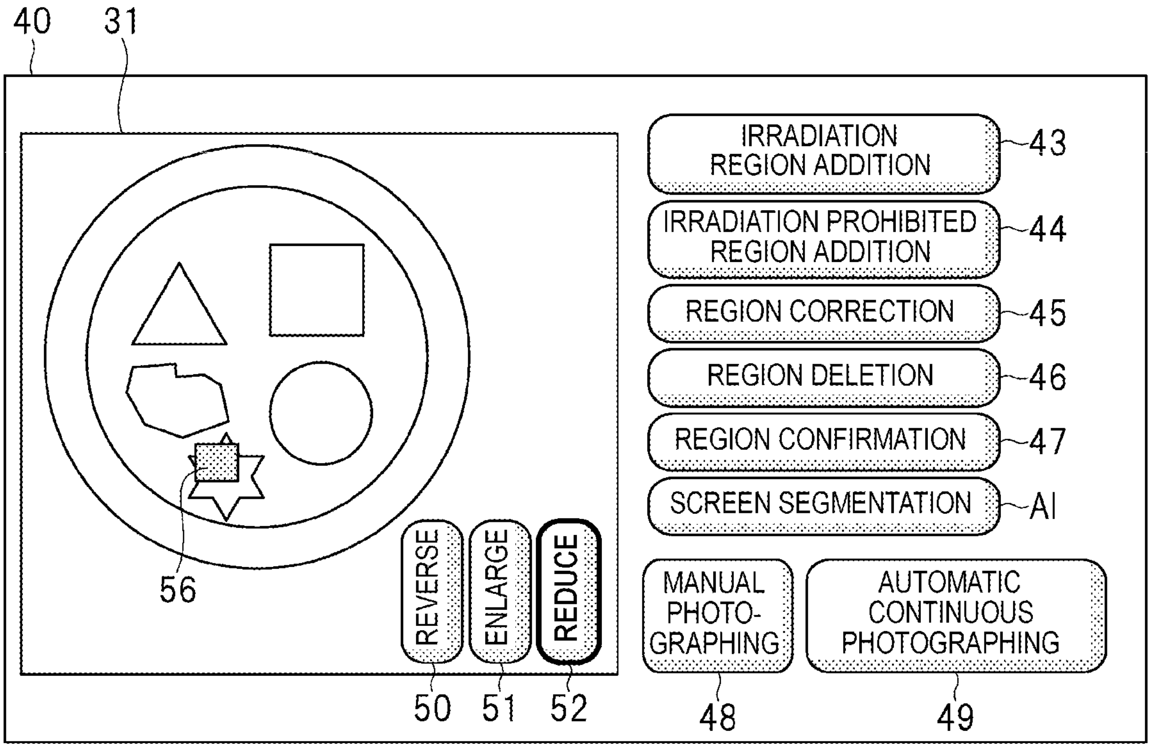
[FIG. 9]
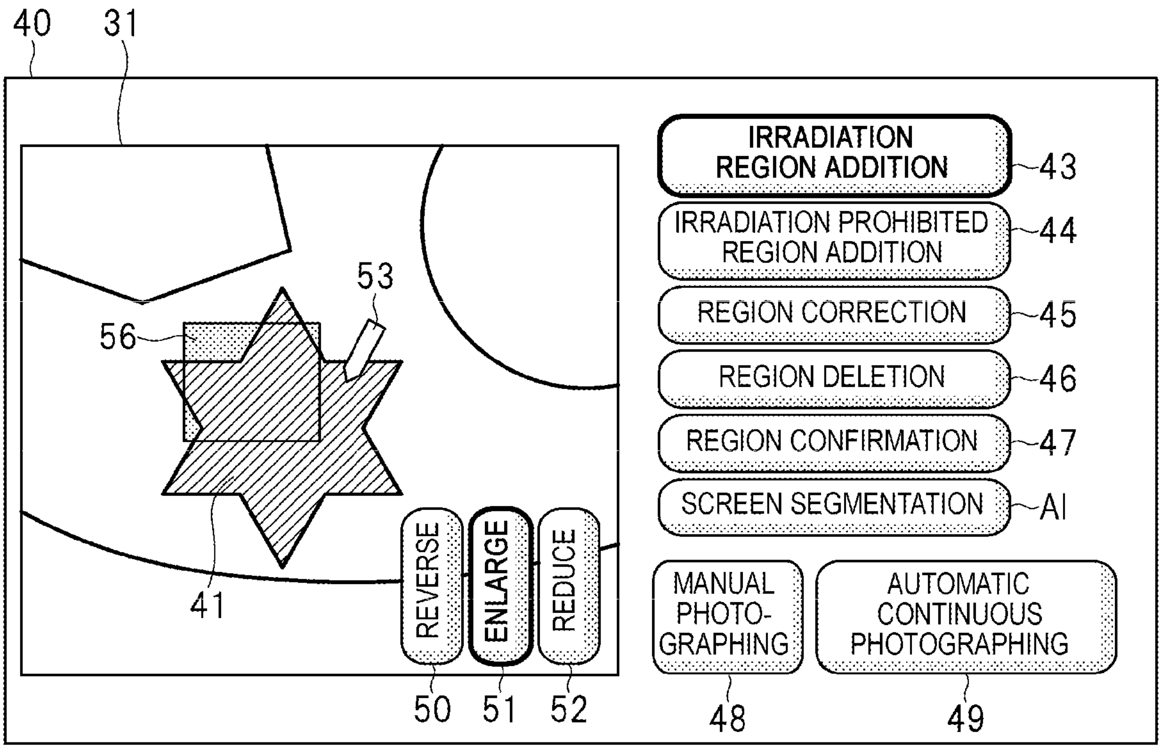

[FIG. 10]
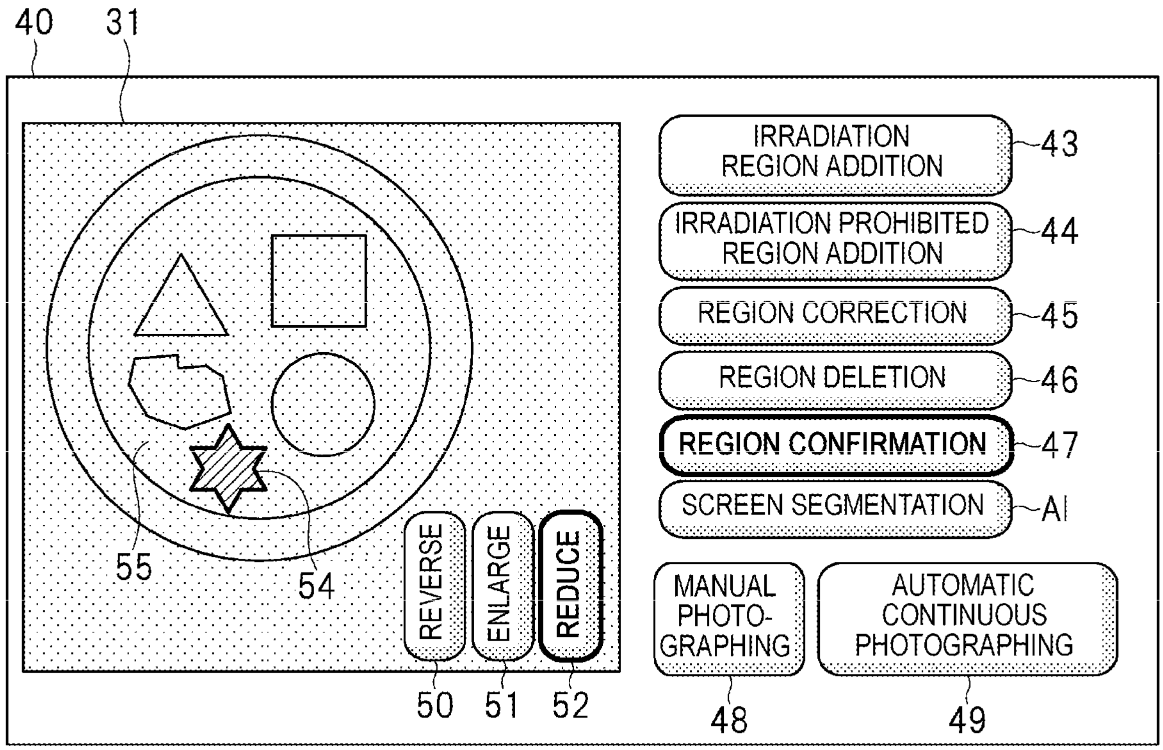
[FIG. 11]
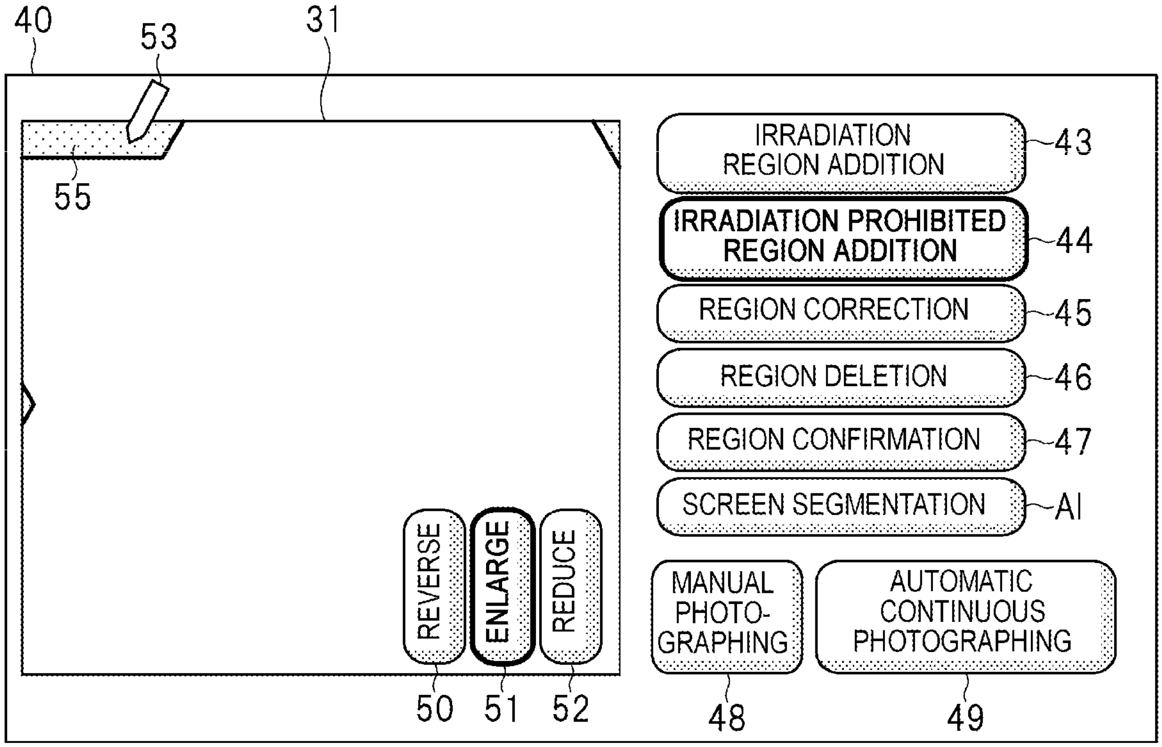

[FIG. 12]
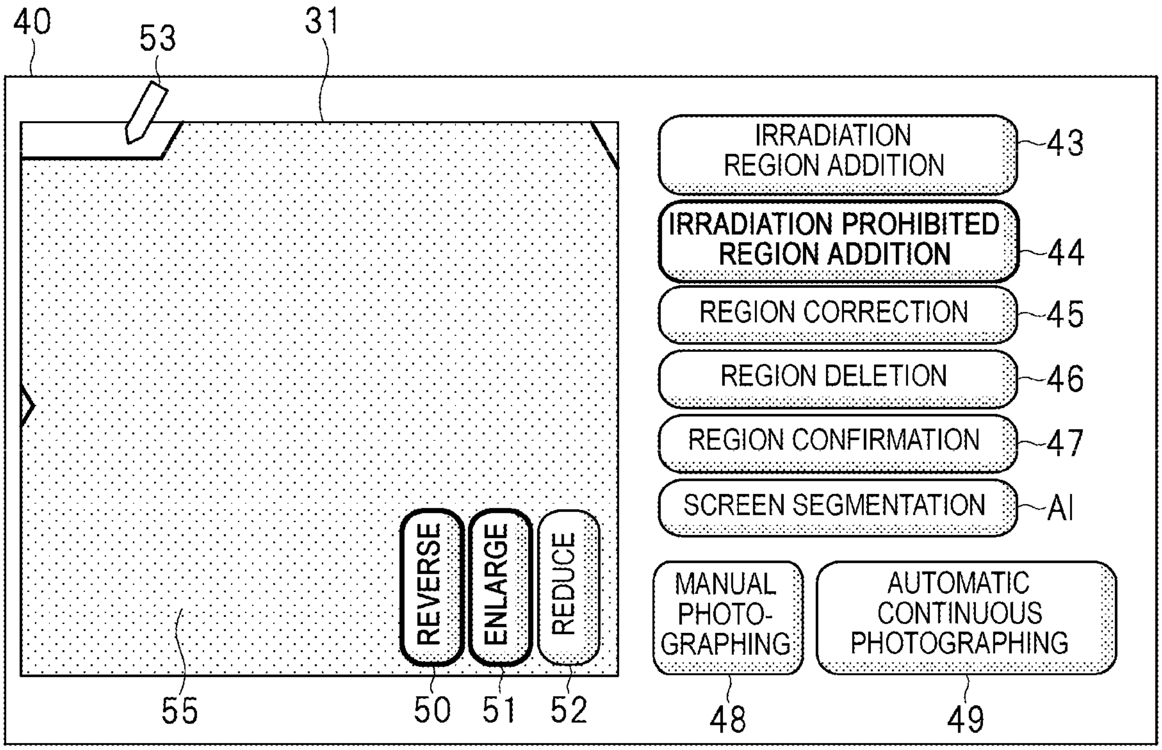
[FIG. 13]
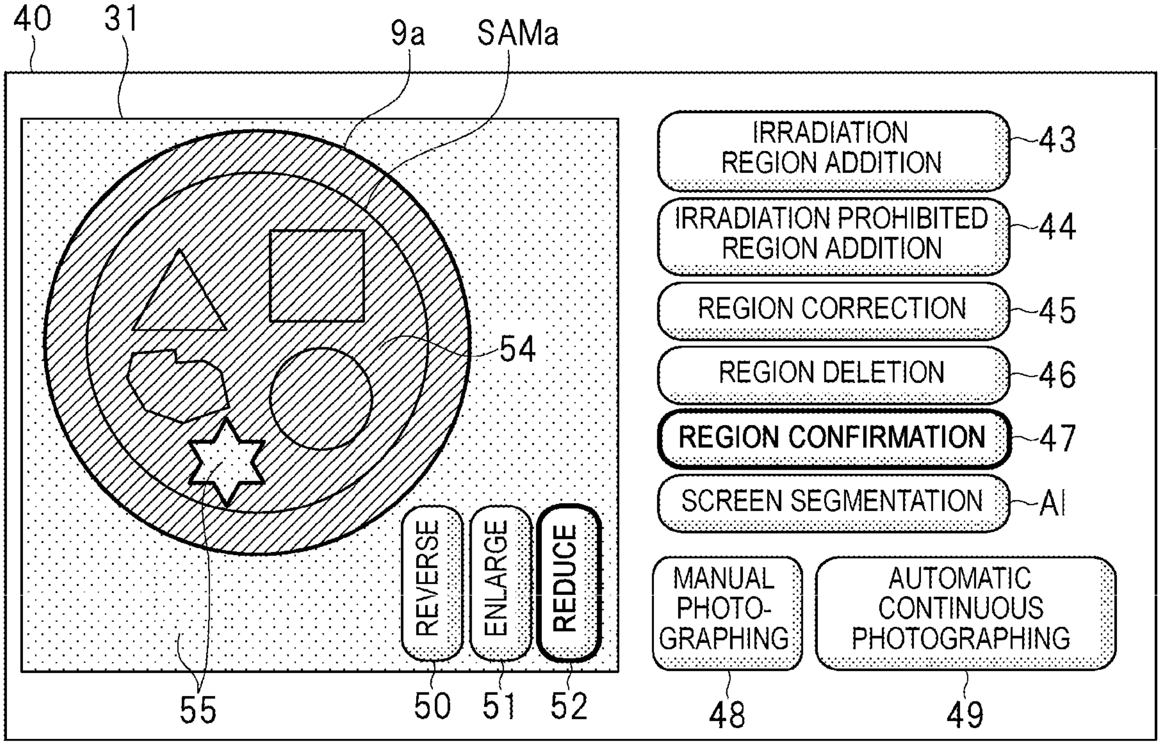

[FIG. 14]
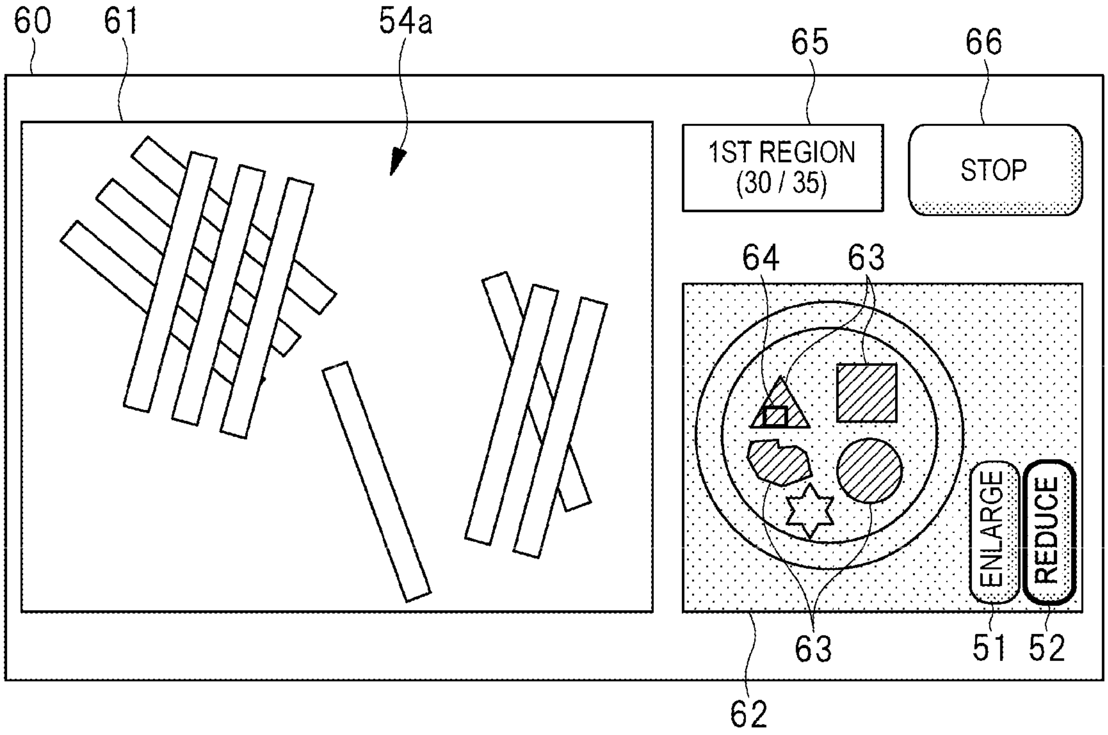
[FIG. 15]
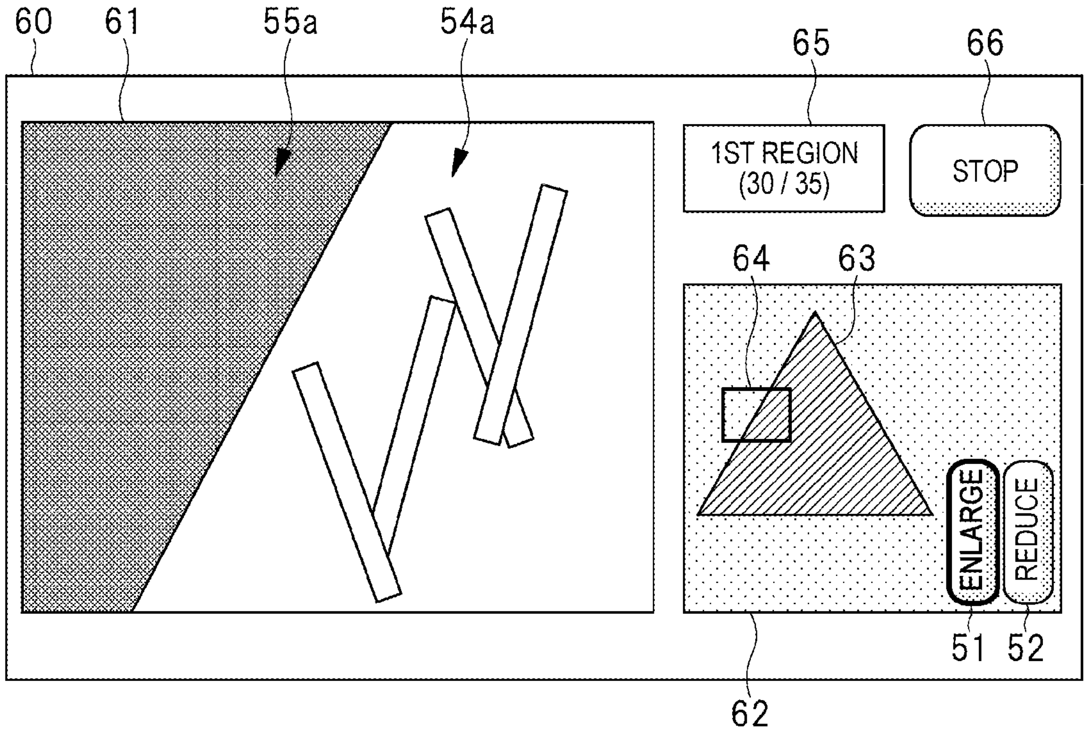

[FIG. 16]
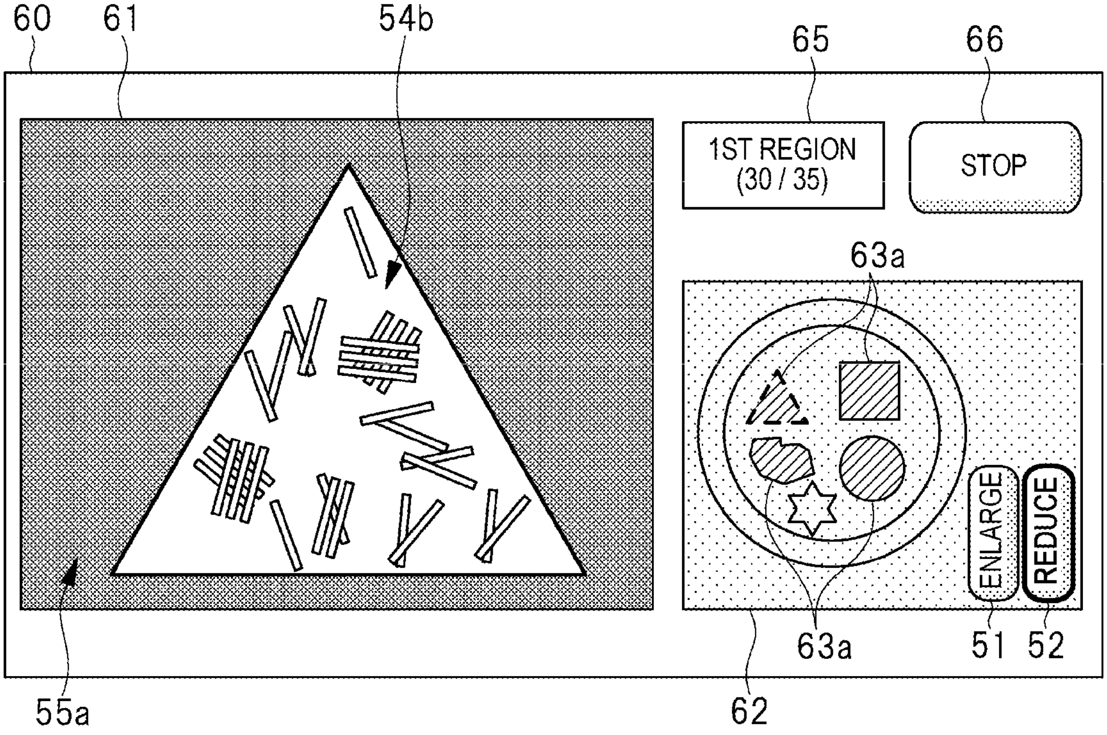

[FIG. 17]
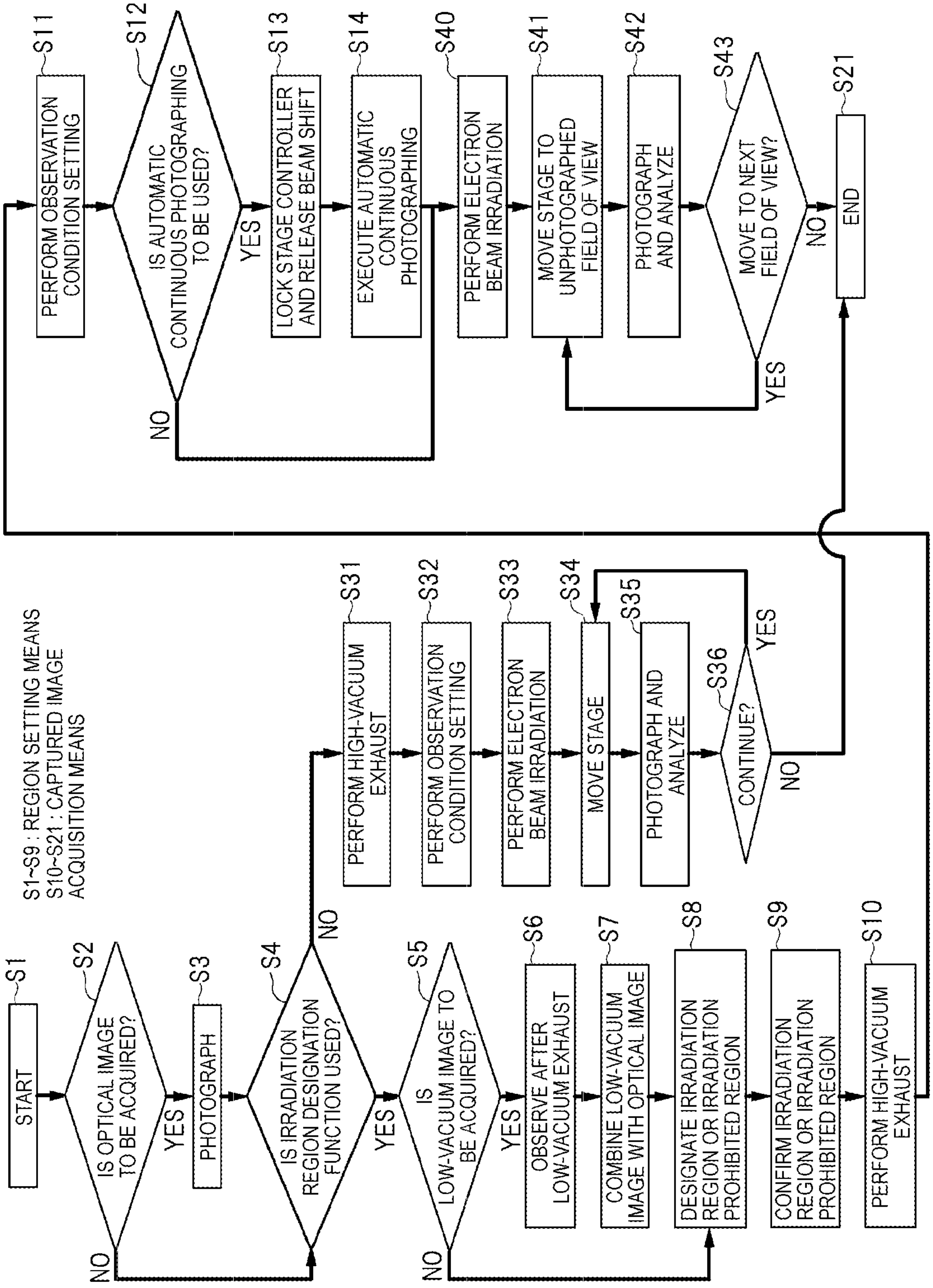

CHARGED PARTICLE BEAM DEVICE

TECHNICAL FIELD

The present invention relates to a charged particle beam apparatus, which can be particularly suitably used for a charged particle beam apparatus provided with means for setting an electron beam irradiation region with respect to a sample to be analyzed.

BACKGROUND ART

In the related art, in a scanning electron microscope (SEM) as a type of charged particle beam apparatus, a sample is analyzed (observed) by installing the sample in a sample chamber set under high vacuum, low vacuum, or atmospheric pressure and irradiating the sample with an electron beam.

Here, under high vacuum, the scattering of the electron beam attributable to atmospheric molecules is slight until the electron beam emitted from an electron gun reaches the sample. However, under low vacuum and atmospheric pressure, the electron beam scattering is substantial because of the large number of atmospheric molecules between the electron gun and the sample. Accordingly, the inside of the sample chamber is exhausted under high vacuum in many cases where a user wants to obtain high-resolution information. In addition, the sample to be analyzed is various, such as a sample made of a conductive or non-conductive material and a sample having both a conductive material and a non-conductive material.

For example, JP-A-2009-192428 (PTL 1) discloses a technique for setting an electron beam irradiation prohibited region in order to prevent deterioration attributable to wiring layer shrinkage or the like in producing a flake sample of a semiconductor device with an FIB-SEM. In PTL 1, a single-field-of-view secondary electron image resulting from an ion beam is acquired under high vacuum and an electron beam irradiation region and an electron beam non-irradiation region are set. Then, only the electron beam irradiation region is irradiated with an electron beam for flake sample thickness measurement.

CITATION LIST

Patent Literature

PTL 1: JP-A-2009-192428

SUMMARY OF INVENTION

Technical Problem

In a case where the region of the non-conductive material of a sample is disposed under high vacuum and the non-conductive material is irradiated with an electron beam, the surface of the sample is charged with a negative charge, which results in various image disturbances such as sample drift and uneven brightness. As a result, it becomes difficult to obtain a satisfactory analysis result.

It is desired in many cases to analyze a sample having both a conductive material and a non-conductive material. Although it is possible to analyze such a sample under low vacuum, the sample is disposed under high vacuum in a case where only the conductive material is analyzed at high magnification or resolution. When the non-conductive material is irradiated with an electron beam at this time, the sample is charged, and thus it is conceivable to prevent the charging by covering the non-conductive material with a conductive paste or the like. However, such work is detailed and requires time and skill. Further, it is not easy to remove the conductive paste from the sample.

In addition, in a case where a part of a sample contains a soft material, the sample may be deformed as a result of electron beam irradiation. In a case where the technique of PTL 1 is used, there is a problem that electron beam-attributable sample deformation cannot be suppressed by an apparatus incapable of ion beam irradiation.

In addition, in PTL 1, in a case where a sample has both a conductive material and a non-conductive material and wide-area analysis is performed on the conductive material using a scanning electron microscope, there is a problem that the analysis cannot be performed due to the effect of charging once the non-conductive material is irradiated with an electron beam under high vacuum.

Required in this regard is a technique for preventing non-conductive and soft materials from being irradiated with an electron beam under high vacuum in a case where wide-area analysis is performed using a charged particle beam apparatus such as a scanning electron microscope. In other words, a technique is required with which the reliability of sample analysis performed using a charged particle beam apparatus is improved. Also required is a technique with which work in the analysis described above is relatively easy and an increase in work time can be suppressed as much as possible.

Other issues and novel features will become apparent from the description and accompanying drawings herein.

Solution to Problem

A brief overview of representative embodiments disclosed in the present application is as follows.

A charged particle beam apparatus in one embodiment includes: a sample chamber; a lens barrel having an electron gun capable of performing irradiation with an electron beam and attached to the sample chamber; a stage allowing a sample to be installed when the sample is analyzed and provided in the sample chamber; a detector provided in the sample chamber and capable of detecting a secondary or backscattered electron emitted from the sample as a signal in a case where the sample installed on the stage is irradiated with the electron beam when the sample is analyzed; a vacuum pump for adjusting an internal pressure of the sample chamber; a control unit having an image processing control circuit capable of converting the signal detected by the detector into a captured image and controlling an operation of each of the electron gun, the stage, the detector, and the vacuum pump; region setting means for setting an irradiation region for irradiating the sample with the electron beam and an irradiation prohibited region for prohibiting the irradiation of the sample with the electron beam using a first captured image of the sample captured under a first pressure; and captured image acquisition means for selectively irradiating the irradiation region with the electron beam with an inside of the sample chamber at a second pressure lower than the first pressure and acquiring a second captured image of the irradiation region based on a secondary or backscattered electron emitted from the irradiation region.

In addition, a charged particle beam apparatus in one embodiment includes: a sample chamber; a lens barrel having an electron gun capable of performing irradiation with an electron beam and attached to the sample chamber; a stage allowing a sample to be installed when the sample is analyzed and provided in the sample chamber; a detector provided in the sample chamber and capable of detecting a secondary or backscattered electron emitted from the sample as a signal in a case where the sample installed on the stage is irradiated with the electron beam when the sample is analyzed; a vacuum pump for adjusting an internal pressure of the sample chamber; a control unit having an image processing control circuit capable of converting the signal detected by the detector into a captured image and controlling an operation of each of the electron gun, the stage, the detector, and the vacuum pump; region setting means for setting an irradiation region for irradiating the sample with the electron beam and an irradiation prohibited region for prohibiting the irradiation of the sample with the electron beam; and captured image acquisition means for selectively irradiating the irradiation region with the electron beam and acquiring a high-vacuum SEM image of the irradiation region based on a secondary or backscattered electron emitted from the irradiation region. The control unit further has a storage medium, the irradiation region includes a plurality of photographing fields of view, and, in the region setting means, a position of the irradiation prohibited region and a position of each of the plurality of photographing fields of view are stored in the storage medium as coordinates of the stage.

Advantageous Effects of Invention

According to one embodiment, it is possible to improve the reliability of sample analysis performed using the charged particle beam apparatus. In addition, work in the analysis is relatively easy and an excessive increase in work time can be suppressed.

BRIEF DESCRIPTION OF DRAWINGS

FIG. 1 is a schematic diagram illustrating an example of a charged particle beam apparatus in Embodiment 1.

FIG. 2 is a schematic diagram illustrating another example of the charged particle beam apparatus in Embodiment 1.

FIG. 3 is a flowchart of an analysis method in Embodiment 1.

FIG. 4 is an irradiation region designation function selection screen in Embodiment 1.

FIG. 5 is an irradiation region setting screen in Embodiment 1.

FIG. 6 is the irradiation region setting screen following FIG. 5.

FIG. 7 is the irradiation region setting screen following FIG. 6.

FIG. 8 is the irradiation region setting screen in Embodiment 1.

FIG. 9 is the irradiation region setting screen following FIG. 8.

FIG. 10 is the irradiation region setting screen following FIG. 9.

FIG. 11 is an irradiation prohibited region setting screen in Embodiment 1.

FIG. 12 is the irradiation prohibited region setting screen following FIG. 11.

FIG. 13 is the irradiation prohibited region setting screen following FIG. 12.

FIG. 14 is an operation screen of the charged particle beam apparatus in Embodiment 1.

FIG. 15 is the operation screen of the charged particle beam apparatus in Embodiment 1.

FIG. 16 is the operation screen of the charged particle beam apparatus in Embodiment 1.

FIG. 17 is a flowchart of an analysis method in Embodiment 2.

DESCRIPTION OF EMBODIMENTS

Hereinafter, embodiments will be described in detail with reference to the drawings. It should be noted that in all the drawings for describing the embodiments, functionally identical members are denoted by the same reference numerals with redundant description omitted. In addition, in the following embodiments, the description of identical or similar parts is not repeated in principle except when the repetition is particularly necessary.

Embodiment 1

<Configuration of Charged Particle Beam Apparatus>

A charged particle beam apparatus 1 in Embodiment 1 will be described below with reference to FIG. 1. In FIG. 1, a scanning electron microscope (SEM) is exemplified as an example of the charged particle beam apparatus 1.

The charged particle beam apparatus 1 illustrated in FIG. 1 is an apparatus for analyzing (observing) a sample SAM by irradiating the sample SAM disposed in a sample chamber 7 with an electron beam from an electron gun 3 provided in a lens barrel 2.

The charged particle beam apparatus 1 includes the sample chamber 7 and the lens barrel 2 attached to the sample chamber 7 and configuring an electron beam column. The lens barrel 2 includes, for example, the electron gun 3 capable of performing irradiation with an electron beam (charged particle beam), a condenser lens 4 for electron beam focusing, a deflection coil 5 for electron beam scanning, and an objective lens 6 for electron beam focusing.

Provided in the sample chamber 7 are, for example, a holder 9 for mounting the sample SAM, a stage 8 for installing the holder 9 (sample SAM), a secondary electron detector 10, a backscattered electron detector 11, and an optical camera 12. When the sample SAM is analyzed, the sample SAM and the holder 9 are transported into the sample chamber 7, installed on the stage 8, and focused on the point of intersection with an optical axis OA. It should be noted that in the present application, the holder 9 where the sample SAM is mounted may be simply described as "sample SAM".

The secondary electron detector 10 is capable of detecting the secondary electrons emitted from the sample SAM as a signal in a case where the sample SAM is irradiated with an electron beam, and the backscattered electron detector 11 is capable of detecting the backscattered electrons emitted from the sample SAM as a signal in a case where the sample SAM is irradiated with an electron beam. In addition, the optical camera 12 is capable of capturing an optical image (low-magnification image, captured image) of the sample SAM or the holder 9 where the sample SAM is mounted.

In addition, although not illustrated in detail in FIG. 1, the backscattered electron detector 11 of the charged particle beam apparatus 1 is, for example, a detector divided into four, and the divided detectors of the backscattered electron detector 11 are provided in the sample chamber 7 so as to face the sample SAM from different directions when the sample SAM is analyzed. A three-dimensional SEM image (captured image) can be acquired by the backscattered electron detector 11 having such a plurality of detectors. A three-dimensional SEM image (captured image) can also be acquired by disposing a plurality of the secondary electron detectors 10 in different directions with respect to the sample SAM.

It should be noted that the secondary electron detector 10 and the backscattered electron detector 11 may be provided outside the lens barrel 2 or may be provided inside the lens barrel 2. In addition, the optical camera 12 does not necessarily have to be mounted in the charged particle beam apparatus 1. In addition, the charged particle beam apparatus 1 may include another lens, another electrode, and another detector.

Outside the sample chamber 7, the charged particle beam apparatus 1 includes a vacuum pump 13, a needle valve 14, and an atmosphere introduction port 15 for adjusting the internal pressure of each of the sample chamber 7 and the lens barrel 2. In addition, outside the sample chamber 7, the charged particle beam apparatus 1 includes a comprehensive control unit C0.

The comprehensive control unit C0 is electrically or physically connected to and controls a scanning signal control unit C1, a signal control unit C2, a vacuum control unit C3, a stage control unit C4, and a storage medium MD. Accordingly, in the present application, it may be described that the control performed by each of the control units C1 to C4 is performed by the comprehensive control unit C0. In addition, the comprehensive control unit C0 including the control units C1 to C4 and the storage medium MD may be regarded as one control unit, and the comprehensive control unit C0 may be simply referred to as "control unit".

The scanning signal control unit C1 is electrically connected to and controls the operations of the electron gun 3, the condenser lens 4, the deflection coil 5, and the objective lens 6. The electron gun 3 receives a control signal from the scanning signal control unit C1 to generate an electron beam, and the electron beam is emitted toward the sample SAM.

Each of the condenser lens 4, the deflection coil 5, and the objective lens 6 receives a control signal from the scanning signal control unit C1 to excite a magnetic field. By the magnetic field of the condenser lens 4, the electron beam is focused so as to have an appropriate beam diameter. By the magnetic field of the deflection coil 5, the electron beam is deflected and two-dimensional scanning is performed on the sample SAM. By the magnetic field of the objective lens 6, the electron beam is refocused on the sample SAM. In addition, the sample SAM can be focused by adjusting the excitation intensity of the objective lens 6.

The signal control unit C2 is electrically connected to and controls the operations of the secondary electron detector 10, the backscattered electron detector 11, and the optical camera 12. In addition, the signal control unit C2 includes an image processing control circuit capable of processing signals detected by the secondary electron detector 10, the backscattered electron detector 11, and the optical camera 12 and converting each signal into a captured image (image data). The captured image is output to a monitor 20.

The vacuum control unit C3 is electrically connected to and controls the operations of the vacuum pump 13 and the needle valve 14. In a case where the sample SAM is analyzed in the charged particle beam apparatus 1, the inside of each of the lens barrel 2 and the sample chamber 7 is vacuum-exhausted by the vacuum pump 13, the needle valve 14, and the atmosphere introduction port 15 and is adjusted from atmospheric pressure to high vacuum or low vacuum.

It should be noted that "high vacuum" and "low vacuum" described in the present application mean states where the pressure in the sample chamber 7 is lower than atmospheric pressure. In addition, "high vacuum" means a state where the pressure in the sample chamber 7 is lower than in "low vacuum". The pressure in "high vacuum" is, for example, $1\times10^{-2}$ Pa or less. The pressure in "low vacuum" is lower than atmospheric pressure and is, for example, 1 Pa or more and 1000 Pa or less.

The stage control unit C4 is electrically connected to the stage 8 and has a function of controlling the operation of the stage 8 to always link the field of view and the coordinates of the stage 8. The storage medium MD is capable of storing information such as each field of view, the coordinates of the stage 8, and an acquired captured image (image data), and the pieces of information are mutually associated.

The stage 8 has an XY-axis drive mechanism drivable in the direction parallel to the placement surface of the charged particle beam apparatus 1, a Z-axis drive mechanism drivable in the direction (height direction) perpendicular to the placement surface, an R-axis drive mechanism drivable in the direction of rotation, and a T-axis drive mechanism drivable in a direction inclined with respect to the XY plane. Each of the drive mechanisms is a mechanism used in order to analyze any part of the sample SAM and the holder 9 installed on the stage 8. As a result, the part of the sample SAM to be analyzed can be moved to the center of the photographing field of view.

The charged particle beam apparatus 1 includes, outside or inside, the monitor 20, a mouse 21, and a trackball 22 electrically connected to the comprehensive control unit C0. By a user working on the monitor 20 using the mouse 21 or the trackball 22, various types of information are input to or output from the comprehensive control unit C0. In addition, in a case where the user manually operates the stage 8, the user can also work using the mouse 21 or the trackball 22.

Another example of the charged particle beam apparatus 1 in Embodiment 1 is illustrated in FIG. 2, which is a schematic diagram of a case where an analyzer is attached to the charged particle beam apparatus 1 of FIG. 1.

An analytical detector 16 is further provided in the sample chamber 7, and the analytical detector 16 is electrically connected to an analyzer control unit C5. The analyzer control unit C5 includes a processing control circuit capable of processing a signal detected by the analytical detector 16 and performing component analysis. An X-ray detector is an example of the analytical detector 16. In a case where the sample SAM is irradiated with an electron beam, the spectrum of the X-ray generated from the sample SAM is detected by the analytical detector 16 and calculated into an electric signal.

In addition, the analyzer control unit C5 is one control unit included in the comprehensive control unit C0, and the control thereof is controlled by the comprehensive control unit C0. Alternatively, the analyzer control unit C5 and the comprehensive control unit C0 may be provided as separate control units or may be interconnected using a cable or the like.

The charged particle beam apparatus 1 in Embodiment 1 illustrated in FIGS. 1 and 2 includes region setting means for setting an irradiation region for irradiating the sample SAM with an electron beam and an irradiation prohibited region for prohibiting the irradiation of the sample SAM with an electron beam. In addition, the charged particle beam apparatus 1 includes captured image acquisition means for selectively irradiating the irradiation region with an electron beam and acquiring a high-vacuum SEM image (captured image) of the irradiation region based on the secondary or backscattered electrons emitted from the irradiation region.

Hereinafter, the region setting means and the captured image acquisition means in Embodiment 1 will be described, including how to set and operate the means. FIG. 3 is a flowchart of a method for analyzing the sample SAM in Embodiment 1, and this analysis method includes the region setting means and the captured image acquisition means.

<Region Setting Means>

Hereinafter, the region setting means in Embodiment 1 will be described while comparing steps S1 to S9 in the flowchart of FIG. 3 with FIGS. 4 to 13.

First, in step S1, the holder 9 is transported into the sample chamber 7 and installed on the stage 8 with the sample SAM mounted. Then, the comprehensive control unit C0 adjusts each drive mechanism of the stage 8 such that the part of the sample SAM to be analyzed is positioned at the center of the field of view. Subsequently, the analysis of the sample SAM is started.

In step S2, it is determined whether or not to acquire an optical image (low-magnification image, captured image) 32. In a case where the optical image 32 is acquired (YES), the next step is step S3. In a case where the optical image 32 is not acquired (NO), the next step is step S4.

In step S3, the optical image 32 of the sample SAM is captured using the optical camera 12 provided in the sample chamber 7. The optical image 32 is captured in a state where the inside of the sample chamber 7 is made low-vacuum by the vacuum pump 13 and the needle valve 14. It should be noted that the optical image 32 may be captured in a state where the inside of the sample chamber 7 is at atmospheric pressure.

In addition, the optical camera 12 is capable of capturing one or a plurality of wide-area images. In addition, the photographing of the optical camera 12 may be manually performed by the user or may be automatically performed by the signal control unit C2. In addition, the photographing of the optical camera 12 may be performed using each drive mechanism (XY-axis, Z-axis, R-axis, and T-axis) of the stage 8.

Determined in step S4 is the use or non-use of an irradiation region designation function. First, as illustrated in FIG. 4, the comprehensive control unit C0 outputs an irradiation region designation function selection screen 30 on the monitor 20 and outputs a low-magnification image display unit 31, a button 34, a button 35, a checkbox 36, and a checkbox 37 to the selection screen 30.

The low-magnification image display unit 31 is provided in order to display a low-magnification image of the sample SAM such as the optical image 32 and a low-vacuum SEM image 56. The button 34 is provided for normal observation selection. The button 35 is provided in order to select observation using the irradiation region designation function. The checkbox 36 is provided in order to set the use or non-use of a low-vacuum SEM image. The checkbox 37 is provided in order to set the use or non-use of an external image.

The optical image 32 captured in step S3 is displayed on the low-magnification image display unit 31. In Embodiment 1, a metal material embedded in a resin material is exemplified as the sample SAM. The low-magnification image display unit 31 displays an outer shape SAMa of the sample SAM, an outer shape 9*a* of the holder 9, and a state where a conductive tape 33 is attached to a part of the metal material to be analyzed so as to be electrically connected to the holder 9 or the stage 8. It should be noted that the sample SAM is not limited to the metal material embedded in the resin material, and various structures such as a plastic-covered conductive member and a semiconductor device can be adopted.

In addition, nothing is displayed on the low-magnification image display unit 31 in a case where the charged particle beam apparatus 1 is not provided with the optical camera 12 or the optical image 32 is not captured in step S2. In this case, the irradiation region designation function can also be used using the low-vacuum SEM image 56 acquired in step S6 (described later), the optical image 32 that is captured externally, or the low-vacuum SEM image 56 that is captured externally.

For example, by the user checking the checkbox 37, the optical image 32 of the sample SAM captured by an optical camera outside the charged particle beam apparatus 1 can be captured by the comprehensive control unit C0 and displayed on the low-magnification image display unit 31. Alternatively, the low-vacuum SEM image 56 of the sample SAM acquired outside the charged particle beam apparatus 1 can be captured by the comprehensive control unit C0 and displayed on the low-magnification image display unit 31.

In a case where the irradiation region designation function is not used (NO), the user clicks the button 34, and then step S31 becomes the next step. Step S31 and the subsequent steps will be described later.

In a case where the irradiation region designation function is used (YES), the next step is step S5 and it is determined whether or not to acquire the low-vacuum SEM image (low-magnification image, captured image) 56. In a case where the low-vacuum SEM image 56 is not acquired (NO), the user clicks the button 35 without checking the checkbox 36. In this case, the next step is step S8. In a case where the low-vacuum SEM image 56 is acquired (YES), the user checks the checkbox 36. In this case, the next step is step S6.

In step S6, the low-vacuum SEM image 56 is captured. The low-vacuum SEM image 56 is captured in a state where the inside of the sample chamber 7 is made low-vacuum by the vacuum pump 13 and the needle valve 14 to the extent that the sample SAM is not charged. In that state, the sample SAM is irradiated with an electron beam and the low-vacuum SEM image 56 of the sample SAM is acquired based on the secondary or backscattered electrons emitted from the sample SAM. One low-vacuum SEM image 56 may be acquired here. Alternatively, a plurality of the low-vacuum SEM images 56 that are continuous or discontinuous may be acquired here.

In step S7, composite image creation is performed by combining the optical image 32 with the low-vacuum SEM image 56. The combination may be manually performed by the user or may be automatically performed by the comprehensive control unit C0.

It should be noted that in a case where there is no optical image 32, only the low-vacuum SEM image 56 is displayed on the low-magnification image display unit 31. In addition, the low-vacuum SEM image 56 acquired outside the charged particle beam apparatus 1 can be combined with the optical image 32. In addition, in a case where the optical image 32 and the low-vacuum SEM image 56 are different in angle or magnification when the optical image 32 and the low-vacuum SEM image 56 are combined, it is possible to create the composite image by optimizing the angle or magnification.

In addition, in a case where the optical image 32 and the low-vacuum SEM image 56 can be simultaneously captured using the charged particle beam apparatus 1 in Embodiment 1, the photographing can be expedited by almost simultaneously capturing the optical image 32 and the low-vacuum SEM image 56. In other words, the photographing can be expedited by continuously capturing the optical image 32 and the low-vacuum SEM image 56 in the process of changing the inside of the sample chamber 7 from atmospheric pressure to low vacuum.

It should be noted that the optical image 32 and the low-vacuum SEM image 56 may be captured under the same pressure or captured under different pressures within a low-vacuum pressure range. In other words, the optical image 32 and the low-vacuum SEM image 56 may be captured under the same pressure or different pressures within a range that is lower than atmospheric pressure and 1 Pa or more.

After the composite image is created, the user clicks the button 35, and then step S8 becomes the next step. It should be noted that when the captured image to be used in the next step or later is determined in step S4 or step S7, calculation is performed by the comprehensive control unit C0 such that the pixel value of the captured image and the coordinates of the stage 8 are linked and the information thereon is stored in the storage medium MD.

An irradiation region 54 and an irradiation prohibited region 55 are set in steps S8 and S9. Specifically, the irradiation region 54 and the irradiation prohibited region 55 are designated in step S8 and confirmed in step S9.

First, as illustrated in FIG. 5, the comprehensive control unit C0 outputs an irradiation region setting screen 40 on the monitor 20 and outputs the low-magnification image display unit 31 and buttons 43 to 52 to the setting screen 40.

The button 43 is provided in order to designate the irradiation region 54. The button 44 is provided in order to designate the irradiation prohibited region 55. The button 45 is provided in order to correct the irradiation region 54 or the irradiation prohibited region 55. The button 46 is provided in order to delete the irradiation region 54 or the irradiation prohibited region 55. The button 47 is provided in order to confirm the irradiation region 54 and the irradiation prohibited region 55. A button AI is used in a case where screen segmentation is used in order to designate and confirm the irradiation region 54 and the irradiation prohibited region 55.

In addition, the button 48 and the button 49 are provided in order to select whether to perform photographing manually or automatically after setting the irradiation region 54 and the irradiation prohibited region 55.

In addition, the reverse button 50 is provided in order to reverse the designated irradiation region 54 and irradiation prohibited region 55. The enlarge button 51 and the reduce button 52 are provided in order to enlarge- or reduce-display the low-magnification image displayed on the low-magnification image display unit 31 (optical image 32 and low-vacuum SEM image 56).

In addition, exemplified in Embodiment 1 is a case where a measurement target (conductive region) 41 made of a conductive material such as a metal material and a non-measurement target (non-conductive region) 42 made of a non-conductive material such as a resin material are mixed in the sample SAM.

<<Setting of Irradiation Region 54 Using Optical Image 32>>

The setting of the irradiation region 54 using the optical image 32 will be described below with reference to FIGS. 5 to 7. It should be noted that in FIG. 5 and later, the conductive tape 33 illustrated in FIG. 4 is not illustrated so that the drawings are easier to see.

When the user clicks the button 43 illustrated in FIG. 5, the comprehensive control unit C0 displays a cursor (region designation pen) 53 on the low-magnification image display unit 31. Further, when the user clicks the enlarge button 51, the low-magnification image (optical image 32) is enlarge-displayed. Such a state is illustrated in FIG. 6.

First, the user uses the cursor 53 to designate any region of the low-magnification image as an irradiation region. In FIG. 6, one of a plurality of the measurement targets 41 is designated as an irradiation region. In addition, as illustrated in FIG. 7, the plurality of measurement targets 41 may be designated as irradiation regions and the irradiation regions can be set to various shapes.

As illustrated in FIG. 7, by the user clicking the button 47, the designated region such as the measurement target 41 is confirmed as the irradiation region 54. In this case, the comprehensive control unit C0 automatically confirms the undesignated region such as the region other than the measurement target 41 as the irradiation prohibited region 55.

In addition, when the user clicks the button 45 after the designation of the irradiation region 54, the user can correct the shape of the irradiation region 54. In addition, when the user clicks the button 46 after the designation of the irradiation region 54, the user can delete the irradiation region 54.

<<Setting of Irradiation Region 54 Using Composite Image of Optical Image 32 and Low-Vacuum SEM Image 56>>

The setting of the irradiation region 54 using the composite image will be described below with reference to FIGS. 8 to 10. The setting in FIGS. 8 to 10 is basically similar to the setting in FIGS. 6 to 9.

In a case where the composite image of the optical image 32 and the low-vacuum SEM image 56 is created in step S7, the optical image 32 and the low-vacuum SEM image 56 are displayed on the low-magnification image display unit 31 as illustrated in FIG. 8. It should be noted that a case where a part different from that in FIG. 5 is the measurement target 41 is exemplified in FIG. 8.

As illustrated in FIG. 9, how to designate the irradiation region 54 is the same as in the case of FIG. 6. In a case where the composite image is used, the region designated by the user may be beyond the boundary between the optical image 32 and the low-vacuum SEM image 56.

Subsequently, as illustrated in FIG. 10, by the user clicking the button 47, the designated region such as the measurement target 41 is confirmed as the irradiation region 54. In this case, the comprehensive control unit C0 automatically confirms the undesignated region such as the region other than the measurement target 41 as the irradiation prohibited region 55.

In addition, a similar method can be used in a case where the irradiation region 54 is designated and confirmed only with the low-vacuum SEM image 56 without using the optical image 32. In that case, the low-magnification image display unit 31 displays a captured image resulting from one low-vacuum SEM image 56 or a captured image resulting from splicing a plurality of the low-vacuum SEM images 56, and the irradiation region 54 can be designated and confirmed on the captured image.

<<Setting of Irradiation Prohibited Region 55 Using Optical Image 32»

The setting of the irradiation prohibited region 55 using the optical image 32 will be described below with reference to FIGS. 11 to 13.

As illustrated in FIG. 11, when the user clicks the button 44, the comprehensive control unit C0 displays the cursor 53 on the low-magnification image display unit 31. The user uses the cursor 53 to designate any region of the low-magnification image as an irradiation prohibited region. In FIG. 11, the non-measurement target 42 is designated as the irradiation prohibited region 55.

In addition, as illustrated in FIG. 12, by the user clicking the reverse button 50, the irradiation region and the irradiation prohibited region are reversed. In other words, the region not designated by the user in FIG. 11 is designated as the irradiation prohibited region 55. Such use of the reverse button 50 and the effect of the use are similar in setting the irradiation region 54 as illustrated in FIGS. 5 to 10.

By the user clicking the button 47 after the irradiation prohibited region 55 is designated in FIG. 11, the designated region such as the non-measurement target 42 is confirmed as the irradiation prohibited region 55 as illustrated in FIG. 13. In this case, the comprehensive control unit C0 automatically confirms the undesignated region as the irradiation region 54.

It should be noted that when the irradiation region 54 and the irradiation prohibited region 55 are confirmed, the comprehensive control unit C0 recognizes the outer shape 9*a* of the holder 9 and automatically confirms the region outside the outer shape 9*a* of the holder 9 as the irradiation prohibited region 55. In addition, the comprehensive control unit C0 automatically confirms the region that is inside the outer shape 9*a* of the holder 9 and other than the irradiation prohibited region 55 as the irradiation region 54.

In addition, it is possible to set the irradiation prohibited region 55 by a similar method using the composite image of the optical image 32 and the low-vacuum SEM image 56 or only the low-vacuum SEM image 56 instead of the optical image 32.

<<Setting of Irradiation Region 54 and Irradiation Prohibited Region 55 Using Image Segmentation>>

It is also possible to use the image segmentation of the comprehensive control unit C0 regarding the setting of the irradiation region 54 and the irradiation prohibited region 55 described above with reference to FIGS. 5 to 13.

By the image segmentation, which is a type of artificial intelligence, the meaning of each of the plurality of pixels in an image can be identified. For example, in the case of the sample SAM in Embodiment 1, by the screen segmentation, the shapes, colors, contrasts, and so on of the measurement target 41 and the non-measurement target 42 can be identified with respect to a captured image such as the optical image 32. As a result, by the screen segmentation, the region corresponding to the measurement target 41 or the non-measurement target 42 in the captured image is automatically designated in the low-magnification image display unit 31.

An example of setting the irradiation region 54 as described with reference to FIGS. 5 to 7 using the screen segmentation will be described below.

For example, when the user clicks the button AI illustrated in FIG. 5, the screen segmentation automatically designates the region of the captured image (optical image 32) corresponding to the irradiation region 54. Here, the measurement target 41 illustrated in FIG. 5 is automatically identified by the screen segmentation, and it is automatically designated that the measurement target 41 corresponds to the irradiation region 54 illustrated in FIG. 6.

Subsequently, as illustrated in FIG. 7, in a case where the designated irradiation region 54 is confirmed by the user, the comprehensive control unit C0 automatically confirms the undesignated region as the irradiation prohibited region 55. In addition, the user can correct the region designated by the image segmentation before the irradiation region 54 is confirmed. In that case, the correction by the user is reflected in the confirmed irradiation region 54.

In addition, the confirmation of the irradiation region 54 as well as the designation of the irradiation region 54 can be automatically performed by the image segmentation. In a case where the designated irradiation region 54 is confirmed by the screen segmentation in that case, the comprehensive control unit C0 automatically confirms the undesignated region as the irradiation prohibited region 55.

In addition, the screen segmentation can be used in a case where the irradiation prohibited region 55 as described with reference to FIGS. 8 to 10 is set by changing the setting of the screen segmentation.

For example, when the user clicks the button AI, the screen segmentation automatically designates the region of the captured image corresponding to the irradiation prohibited region 55. Here, the non-measurement target 42 is automatically identified by the screen segmentation, and it is automatically designated that the measurement target 41 corresponds to the irradiation prohibited region 55.

Subsequently, in a case where the designated irradiation prohibited region 55 is confirmed by the user or the screen segmentation, the comprehensive control unit C0 automatically confirms the undesignated region as the irradiation region 54. In addition, similarly to the correction of the irradiation region 54, the user can correct the region designated by the image segmentation before the irradiation prohibited region 55 is confirmed. In that case, the correction by the user is reflected in the confirmed irradiation prohibited region 55.

When the irradiation region 54 and the irradiation prohibited region 55 are confirmed, the positions of the irradiation region 54 and the irradiation prohibited region 55 are stored in the storage medium MD as the coordinates of the stage 8 by the comprehensive control unit C0. It should be noted that the irradiation region 54 includes a plurality of photographing fields of view to be analyzed. Accordingly, the positions of the plurality of photographing fields of view are stored in the storage medium MD as the coordinates of the stage 8.

As for the screen segmentation, the accuracy of identification can be improved each time by performing identification many times regarding a sample identical or similar to the sample SAM. In addition, by the screen segmentation pre-learning material information such as the color and contrast in the captured image, the screen segmentation is capable of automatically designating the region corresponding to the measurement target 41 or the non-measurement target 42 even in the case of a sample that the screen segmentation identifies for the first time.

In addition, the captured image identified by the screen segmentation is not limited to the optical image 32. Also applicable are the low-vacuum SEM image 56 or the composite image of the optical image 32 and the low-vacuum SEM image 56.

This is the end of the description of the region setting means in Embodiment 1.

<Captured Image Acquisition Means>

The captured image acquisition means in Embodiment 1 will be described below using steps S10 to S21 in the flowchart of FIG. 3.

After the irradiation region 54 and the irradiation prohibited region 55 are confirmed in step S9, in step S10, the inside of the sample chamber 7 is exhausted by the vacuum pump 13 so as to become high-vacuum.

Photographing conditions are set in step S11. The user sets various photographing conditions such as magnification, acceleration voltage, signal to be used, and scanning speed with respect to the irradiation region 54.

In step S12, it is determined whether or not to use an automatic continuous photographing function. In a case where the automatic continuous photographing is not performed (NO), the user clicks the button 48 for manual photographing provided on the irradiation region setting screen 40. In that case, the next step is step S15. In a case where the automatic continuous photographing is performed (YES), the user clicks the button 49 for automatic continuous photographing. In that case, the next step is step S13.

Stage controller locking and beam shift release are performed in step S13. By setting these, the stage 8 is not operated by the user during the automatic continuous photographing.

In step S14, the execution of the automatic continuous photographing is confirmed and the operations of step S15 and the subsequent steps are automatically performed. It should be noted that the operations of step S15 and the subsequent steps are performed by the user in a case where manual photographing is selected in step S12.

In step S15, the stage 8 is moved by the stage control unit C4. Next, in step S16, it is determined whether or not the irradiation region 54 is present directly below the objective lens 6. In a case where the irradiation region 54 is absent (NO) and the irradiation prohibited region 55 is directly below, for example, the objective lens 6, the stage 8 is moved again in step S15. In a case where the irradiation region 54 is present (YES), the next step is step S17.

As described above, the irradiation region 54 includes a plurality of photographing fields of view to be analyzed. Basically, the stage 8 moves based on the coordinates of the stage 8 stored in the storage medium MD such that the unphotographed field of view among the plurality of photographing fields of view is positioned at the electron beam irradiation position.

Electron beam irradiation is performed in step S17. An electron beam is emitted from the electron gun 3 by the scanning signal control unit C1, and the unphotographed field of view of the irradiation region 54 is selectively irradiated with the electron beam.

In step S18, the irradiation region 54 of the sample SAM is photographed and analyzed. A captured image of the unphotographed field of view is acquired based on the secondary or backscattered electrons emitted from the unphotographed field of view irradiated with the electron beam. In addition, if necessary, component analysis may be performed on the irradiation region 54 using the analytical detector 16 illustrated in FIG. 2.

In step S19, it is determined whether or not to move to another unphotographed field of view. In the case of moving to another unphotographed field of view (YES), the next step is step S20, and then steps S15 to S18 are repeated a plurality of times.

In step S20, beam blanking is performed on the electron beam or the electron beam irradiation is stopped during the movement of the stage 8. During the transition from step S18 to step S15, the movement of the stage 8 may cause the irradiation prohibited region 55 or the boundary between the irradiation region 54 and the irradiation prohibited region 55 to be positioned at the electron beam irradiation position. In other words, the irradiation prohibited region 55 may be irradiated with the electron beam.

As described in the above problem, in a case where the irradiation prohibited region 55 is a non-conductive material such as a resin material, analysis becomes difficult due to the effect of charging once the non-conductive material is irradiated with an electron beam. In addition, in a case where the irradiation prohibited region 55 is a soft material, the sample SAM may be deformed as a result of electron beam irradiation. Accordingly, in Embodiment 1, the above problem is suppressed by stopping or blocking the electron beam irradiation during the movement of the stage 8.

It should be noted that a method by which electron beam shielding is performed using a shielding plate, a method by which the acceleration voltage of an electron beam becomes 0 kV, a method by which the bias of a part of the electron gun 3 is maximized and the electron beam generated from the electron gun is focused to the limit, or the like may be used as another electron beam non-irradiation method.

In the case of not moving to another unphotographed field of view (NO) in step S19, such as a case where every unphotographed field of view is completely photographed, the next step is step S21 and the analysis of the sample SAM ends.

An operation screen 60 of the charged particle beam apparatus 1 in a case where the irradiation region designation function is used will be described below with reference to FIGS. 14 to 16.

First, as illustrated in FIG. 14, the comprehensive control unit C0 outputs the operation screen 60 of the irradiation region designation function on the monitor 20 and outputs a high-magnification image display unit 61, a display unit 62 for region confirmation, a region count display field 65, a stop button 66 for stopping the automatic continuous photographing, the enlarge button 51, and the reduce button 52 to the operation screen 60.

A low-magnification image such as the optical image 32 is displayed on the display unit 62 for region confirmation, and a region frame 63 in the process of photographing and a field-of-view frame 64 in the process of photographing are displayed on the low-magnification image. It should be noted that the region frame 63 in the process of photographing corresponds to the irradiation region 54 confirmed in the region setting means.

In a case where the field-of-view frame 64 in the process of photographing is in the irradiation region 54, the high-magnification image display unit 61 displays a high-vacuum SEM image (high-magnification image, captured image) 54*a* of the irradiation region 54. It should be noted that the color on the screen can be changed or the captured high-vacuum SEM image 54*a* can be attached in the already photographed region such that confirmation by the user is performed with ease.

FIG. 15 illustrates the operation screen 60 in the process of photographing the vicinity of the boundary between the irradiation region 54 and the irradiation prohibited region 55. As described above, no electron beam irradiation is performed in the irradiation prohibited region 55. Accordingly, on the high-magnification image display unit 61, the irradiation prohibited region 55 is displayed in black as a non-display region 55*a*.

By observing and photographing the plurality of photographing fields of view of the irradiation region 54 as described above, the high-vacuum SEM images 54*a* thereof can be acquired. In other words, a plurality of the high-vacuum SEM images 54*a* can be acquired by step S18 performed a plurality of times.

FIG. 16 illustrates the operation screen 60 after the acquisition of the plurality of high-vacuum SEM images 54*a*. A plurality of photographing completed regions 63*a* are displayed on the display unit 62 for region confirmation. The high-magnification image display unit 61 displays a spliced SEM image (high-magnification image, captured image) 54*b* of the photographing completed region 63*a* selected by the user among the plurality of photographing completed regions 63*a*. It should be noted that the region other than the spliced SEM image 54*b* is displayed in black as the non-display region 55*a*.

The spliced SEM image 54*b* can be created by splicing the plurality of high-vacuum SEM images 54*a*. In addition, also in the other photographing completed regions 63*a*, the spliced SEM images 54*b* can be created by splicing the respective high-vacuum SEM images 54*a*.

In this manner, a captured image of the irradiation region 54 to be analyzed in the sample SAM can be acquired by the captured image acquisition means of Embodiment 1.

<Method for Performing Analysis without Using Irradiation Region Designation Function>

Hereinafter, an analysis method for analyzing the sample SAM without using the irradiation region designation function in Embodiment 1 will be described using steps S31 to S36 in the flowchart of FIG. 3.

In a case where the irradiation region designation function is not used in step S4 (NO), the user clicks the button 34 for normal observation to execute steps S31 to S36.

As in step S10, in step S31, the inside of the sample chamber 7 is exhausted so as to become high-vacuum. In step S32, photographing conditions are set as in step S11.

In step S33, the sample SAM is irradiated with an electron beam. In step S34, the stage 8 is moved such that the region to be analyzed such as the measurement target 41 is irradiated with an electron beam. In step S35, the region to be analyzed is photographed or analyzed.

In step S36, it is determined whether or not to continue with the analysis. In the case of continuation of the analysis of another photographing field of view (YES), steps S34 and S35 are repeated a plurality of times. In the case of non-continuation of the analysis of another photographing field of view (NO), a series of photographing and analysis ends in step S21.

Main Effects in Embodiment 1

The region setting means in Embodiment 1 uses the irradiation region designation function, and the captured image acquisition means in Embodiment 1 acquires a captured image under the conditions set by the irradiation region designation function.

In other words, before the acquisition of a high-magnification image of the sample SAM, the irradiation region 54 and the irradiation prohibited region 55 of the sample SAM are set using a low-magnification image captured under low vacuum such as the optical image 32, the low-vacuum SEM image 56, and the composite image thereof. Then, a captured image of the irradiation region 54 is acquired based on the set irradiation region 54 and irradiation prohibited region 55.

In Embodiment 1, in a case where the sample SAM has, for example, both a conductive material and a non-conductive material, it is possible to solve the problem that the non-conductive material is irradiated with an electron beam under high vacuum and the sample SAM is charged. In addition, even in a case where a part of the sample SAM contains a soft material, it is possible to solve the problem that the sample SAM is deformed as a result of electron beam irradiation by setting the region where the soft material is present as the irradiation prohibited region 55.

Accordingly, with the technique disclosed in Embodiment 1, it is possible to improve the reliability of analysis of the sample SAM even in a case where wide-area analysis is performed using the charged particle beam apparatus 1.

In addition, the existing equipment provided in the charged particle beam apparatus 1 is used for low-magnification image acquisition, and thus the charged particle beam apparatus 1 can be developed at a suppressed cost.

In addition, the setting of the irradiation region 54 and the irradiation prohibited region 55 requires no difficult work and, as such, can be executed within a short work time. Further, the work time can be shortened using the screen segmentation. In other words, a user's work is relatively easy in analyzing the sample SAM, and an excessive increase in the user's work time can be suppressed.

Embodiment 2

Hereinafter, the charged particle beam apparatus 1 according to Embodiment 2 will be described with reference to FIG. 17. It should be noted that differences from Embodiment 1 will be mainly described below.

In Embodiment 2, the irradiation region 54 is analyzed with not the electron beam but the stage 8 controlled such that the electron beam irradiation position is always the irradiation region 54. FIG. 17 is a flowchart of the analysis method in Embodiment 2. FIG. 17 of Embodiment 2 differs from FIG. 3 of Embodiment 1 in terms of the steps performed between step S12 or step S14 and step S21.

In Embodiment 2, step S40 is performed after step S12 or step S14. In step S40, an electron beam is emitted from the electron gun 3 by the scanning signal control unit C1.

Next, in step S41, the stage 8 is moved by the stage control unit C4. The stage 8 moves based on the coordinates of the stage 8 stored in the storage medium MD such that the unphotographed field of view among the plurality of photographing fields of view included in the irradiation region 54 is positioned at the electron beam irradiation position.

Next, in step S42, the irradiation region 54 is photographed and analyzed.

Next, in step S43, it is determined whether or not to move to another unphotographed field of view. In the case of moving to another unphotographed field of view (YES), the next step is step S41, and then step S41 and step S42 are repeated a plurality of times. In the case of not moving to another unphotographed field of view (NO), the next step is step S21 and the analysis of the sample SAM ends.

In Embodiment 2, electron beam irradiation is neither stopped nor blocked, and only the irradiation region 54 is always irradiated with an electron beam. In other words, during the transition from step S42 to step S41, the stage 8 moves such that the irradiation prohibited region 55 or the boundary between the irradiation region 54 and the irradiation prohibited region 55 is not positioned at the electron beam irradiation position and the next unphotographed field of view is positioned at the electron beam irradiation position.

In a case where analysis is performed by controlling the stage 8 in this manner, the analysis of the end portion of the irradiation region 54 (near the boundary between the irradiation region 54 and the irradiation prohibited region 55) becomes slightly difficult as compared with Embodiment 1. In a case where it is desired to photograph the end portion of the irradiation region 54, a captured image of the end portion can be obtained by changing the magnification in the end portion to a high magnification and reducing the area of the photographing field of view. However, the photographing count needs to be increased as the area of the photographing field of view is reduced, which leads to an increase in photographing time. Accordingly, Embodiment 1 is superior to Embodiment 2 in a case where it is desired to photograph the end portion in detail.

Meanwhile, in a case where the end portion of the irradiation region 54 does not have to be photographed and it is sufficient to photograph the middle portion of the irradiation region 54 and the periphery thereof, analysis can be expedited by the analysis method of Embodiment 2 as electron beam irradiation does not have to be stopped or blocked in the analysis method of Embodiment 2 by the control of the stage 8 as compared with the electron beam control-based analysis method of Embodiment 1.

It should be noted that in a case where the button 48 for manual photographing is clicked in step S12, the irradiation prohibited region 55 can be disposed directly below the objective lens 6, but the entire surface of the high-magnification image display unit 61 becomes the non-display region 55*a* on the operation screen 60.

Although the present invention has been specifically described above based on the above embodiments, the present invention is not limited to the above embodiments and can be variously modified without departing from the gist thereof.

REFERENCE SIGNS LIST

1: charged particle beam apparatus
2: lens barrel
3: electron gun
4: condenser lens
5: deflection coil
6: objective lens
7: sample chamber
8: stage
9: holder
9*a*: outer shape of holder
10: secondary electron detector
11: backscattered electron detector
12: optical camera
13: vacuum pump
14: needle valve
15: atmosphere introduction port
20: monitor
21: mouse
22: trackball
30: irradiation region designation function selection screen
31: low-magnification image display unit
32: optical image (captured image)
33: conductive tape
34, 35: button
36, 37: checkbox
40: irradiation region setting screen
41: measurement target (conductive region)
42: non-measurement target (non-conductive region)
43 to 49: button
50: reverse button
51: enlarge button
52: reduce button
53: cursor
54: irradiation region
54*a*: high-vacuum SEM image (captured image)
54*b*: spliced SEM image (captured image)
55: irradiation prohibited region
55*a*: non-display region
56: low-vacuum SEM image (captured image)
60: operation screen
61: high-magnification image display unit
62: display unit for region confirmation
63: region frame in process of photographing
63*a*: photographing completed region
64: field-of-view frame in process of photographing
65: region count display field
66: stop button
C0 to C5: control unit
MD: storage medium
OA: optical axis
S1 to S21, S31 to S36, S40 to S43: step
SAM: sample
SAMa: outer shape of sample

The invention claimed is:

1. A charged particle beam apparatus comprising:
a sample chamber;
a lens barrel having an electron gun capable of performing irradiation with an electron beam and attached to the sample chamber;
a stage allowing a sample to be installed when the sample is analyzed and provided in the sample chamber;
a detector provided in the sample chamber and capable of detecting a secondary or backscattered electron emitted from the sample as a signal in a case where the sample installed on the stage is irradiated with the electron beam when the sample is analyzed;
a vacuum pump for adjusting an internal pressure of the sample chamber;
a control unit having an image processing control circuit capable of converting the signal detected by the detector into a captured image and controlling an operation of each of the electron gun, the stage, the detector, and the vacuum pump;
a region setter for setting an irradiation region for irradiating the sample with the electron beam and an irradiation prohibited region for prohibiting the irradiation of the sample with the electron beam using a first captured image of the sample captured under a first pressure;
a captured image acquirer for selectively irradiating the irradiation region with the electron beam with an inside of the sample chamber at a second pressure lower than the first pressure and acquiring a second captured image of the irradiation region based on a secondary or backscattered electron emitted from the irradiation region; and
an optical camera provided in the sample chamber, wherein the region setter is configured for capturing an optical image of the sample with the optical camera with the inside of the sample chamber at the first pressure, and the first captured image is the optical image.

2. The charged particle beam apparatus according to claim 1, further comprising an optical camera provided in the sample chamber, wherein
the region setter is configured for:
capturing an optical image of the sample with the optical camera with the inside of the sample chamber at the first pressure; and
irradiating the sample with the electron beam with the inside of the sample chamber at the first pressure and acquiring a third captured image of the sample based on the secondary or backscattered electron emitted from the sample, and
the first captured image is a composite image in which the third captured image is combined with the optical image.

3. The charged particle beam apparatus according to claim 1, wherein the region setter is configured for capturing an optical image of the sample captured by an optical camera outside the charged particle beam apparatus with the control unit, and the first captured image is the optical image.

4. The charged particle beam apparatus according to claim 1, wherein the region setter is configured for allowing:

a user to designate any region of the first captured image as the irradiation region or the irradiation prohibited region; and the control unit to automatically confirm an undesignated region as the irradiation prohibited region in a case where the designated region is confirmed by the user as the irradiation region or the control unit to automatically confirm an undesignated region as the irradiation region in a case where the designated region is confirmed by the user as the irradiation prohibited region.

5. The charged particle beam apparatus according to claim 1, wherein the control unit further has an image segmentation, and the region setter is configured for allowing the image segmentation to automatically designate a region of the first captured image corresponding to the irradiation region or the irradiation prohibited region.

6. The charged particle beam apparatus according to claim 5, wherein the region setter is configured for allowing, in a case where the designated region is confirmed by a user or the image segmentation as either the irradiation region or the irradiation prohibited region, the control unit to automatically confirm an undesignated region as the other of the irradiation region and the irradiation prohibited region.

7. The charged particle beam apparatus according to claim 6, wherein the region setter is further configured for allowing the user to correct the region designated by the image segmentation, and wherein the correction by the user is reflected in the confirmed irradiation region and the confirmed irradiation prohibited region.

8. The charged particle beam apparatus according to claim 1, wherein the control unit further has a storage medium, and a position of the irradiation region and a position of the irradiation prohibited region are stored in the storage medium as coordinates of the stage.

9. The charged particle beam apparatus according to claim 8, wherein the irradiation region includes a plurality of photographing fields of view, respective positions of the plurality of photographing fields of view are stored in the storage medium as the coordinates of the stage, and the captured image acquirer is configured for:

(a) moving the stage based on the coordinates of the stage stored in the storage medium such that an unphotographed field of view among the plurality of photographing fields of view is positioned at an irradiation position of the electron beam;

(b) selectively irradiating the unphotographed field of view with the electron beam and acquiring a captured image of the unphotographed field of view based on a secondary or backscattered electron emitted from the unphotographed field of view;

(c) repeating the limitation (a) and the limitation (b) a plurality of times; and (d) creating the second captured image by splicing captured images of the plurality of photographing fields of view acquired in the limitation (b) performed the plurality of times.

10. The charged particle beam apparatus according to claim 9, wherein the electron beam irradiation is stopped or blocked in a case where the irradiation prohibited region or a boundary between the irradiation region and the irradiation prohibited region is positioned at the irradiation position of the electron beam during a transition from the limitation (b) to the limitation (a) in the limitation (c).

11. The charged particle beam apparatus according to claim 9, wherein the stage is moved such that the irradiation prohibited region or a boundary between the irradiation region and the irradiation prohibited region is not positioned at the irradiation position of the electron beam and a next unphotographed field of view is positioned at the irradiation position of the electron beam during a transition from the limitation (b) to the limitation (a) in the limitation (c).

12. A charged particle beam apparatus comprising:

a sample chamber;

a lens barrel having an electron gun capable of performing irradiation with an electron beam and attached to the sample chamber;

a stage allowing a sample to be installed when the sample is analyzed and provided in the sample chamber;

a detector provided in the sample chamber and capable of detecting a secondary or backscattered electron emitted from the sample as a signal in a case where the sample installed on the stage is irradiated with the electron beam when the sample is analyzed;

a vacuum pump for adjusting an internal pressure of the sample chamber;

a control unit having an image processing control circuit capable of converting the signal detected by the detector into a captured image and controlling an operation of each of the electron gun, the stage, the detector, and the vacuum pump;

a region setter for setting an irradiation region for irradiating the sample with the electron beam and an irradiation prohibited region for prohibiting the irradiation of the sample with the electron beam; and a captured image acquirer for selectively irradiating the irradiation region with the electron beam and acquiring a high-vacuum SEM image of the irradiation region based on a secondary or backscattered electron emitted from the irradiation region, wherein the control unit further has a storage medium, the irradiation region includes a plurality of photographing fields of view, a position of the irradiation prohibited region and a position of each of the plurality of photographing fields of view are stored in the storage medium as coordinates of the stage, a region setting is performed using an optical image or a low-vacuum SEM image of the sample captured under a first pressure, and a captured image acquisition is performed with an inside of the sample chamber at a second pressure lower than the first pressure, and wherein the captured image acquirer is configured for:

(a) moving the stage based on the coordinates of the stage stored in the storage medium such that an unphotographed field of view among the plurality of photographing fields of view is positioned at an irradiation position of the electron beam;

(b) selectively irradiating the unphotographed field of view with the electron beam and acquiring a captured image of the unphotographed field of view based on a secondary or backscattered electron emitted from the unphotographed field of view;

(c) repeating the limitation (a) and the limitation (b) a plurality of times; and (d) creating the high-vacuum SEM image of the irradiation region by splicing captured images of the plurality of photographing fields of view acquired in the limitation (b) performed the plurality of times.

* * * * *